(12) United States Patent
Tsai et al.

(10) Patent No.: US 12,279,461 B2
(45) Date of Patent: Apr. 15, 2025

(54) IMAGE SENSOR

(71) Applicant: VisEra Technologies Company Limited, Hsin-Chu (TW)

(72) Inventors: Wei-Lung Tsai, Hsin-Chu (TW); Ching-Chiang Wu, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 283 days.

(21) Appl. No.: 17/963,428

(22) Filed: Oct. 11, 2022

(65) Prior Publication Data

US 2024/0121972 A1  Apr. 11, 2024

(51) Int. Cl.
*H10F 39/12* (2025.01)
*H10F 39/00* (2025.01)
*H10K 39/32* (2023.01)

(52) U.S. Cl.
CPC ......... *H10F 39/191* (2025.01); *H10F 39/192* (2025.01); *H10F 39/8053* (2025.01); *H10F 39/8063* (2025.01); *H10F 39/807* (2025.01); *H10K 39/32* (2023.02)

(58) Field of Classification Search
CPC ........... H01L 27/1463; H01L 27/14665; H01L 27/14667; H10K 39/32; H10F 39/191; H10F 39/192
See application file for complete search history.

(56) References Cited

U.S. PATENT DOCUMENTS

| 6,707,075 | B1 | 3/2004 | Rogers et al. | |
| 2014/0035082 | A1* | 2/2014 | Chu | H01L 27/14689 |
| | | | | 257/E31.124 |
| 2015/0061061 | A1* | 3/2015 | Wang | H01L 27/14685 |
| | | | | 438/70 |
| 2015/0091115 | A1* | 4/2015 | Lin | H01L 27/14667 |
| | | | | 257/432 |

FOREIGN PATENT DOCUMENTS

| CN | 106856201 A | 6/2017 |
| CN | 110137193 A | 8/2019 |
| JP | 2008235681 A | 10/2008 |

(Continued)

OTHER PUBLICATIONS

Office Action with the search report of its corresponding TW application No. 111148210 issued on Sep. 12, 2023.

(Continued)

*Primary Examiner* — Zandra V Smith
*Assistant Examiner* — Molly K Reida
(74) *Attorney, Agent, or Firm* — MUNCY, GEISSLER, OLDS & LOWE, P.C.

(57) ABSTRACT

An image sensor is provided. The image sensor includes a substrate and isolation structures disposed on the substrate. The isolation structures are electrically non-conductive and define pixel regions. The image sensor also includes electrodes disposed on the substrate and in direct contact with the isolation structures. The image sensor further includes an active layer disposed between the isolation structures. Moreover, the image sensor includes an encapsulation layer disposed over the active layer. The image sensor also includes a color filter layer disposed over the encapsulation layer.

19 Claims, 13 Drawing Sheets

(56) References Cited

FOREIGN PATENT DOCUMENTS

| JP | 2011159757 A | 8/2011 |
|---|---|---|
| JP | 2022047438 A | 3/2022 |
| TW | 201507115 A | 2/2015 |
| TW | 201916339 A | 4/2019 |
| WO | WO2017047422 A1 | 3/2017 |
| WO | WO2019093479 A1 | 5/2019 |
| WO | WO2021251006 A1 | 12/2021 |

OTHER PUBLICATIONS

An Office Action for JP Application No. 2023-067847, dated Jun. 24, 2024 with its English translation is attached, 9 pages.

* cited by examiner

IMAGE SENSOR

BACKGROUND

Technical Field

The embodiments of the present disclosure relate to image sensors, and in particular they relate to image sensors without a transparent electrode between the active layer and the encapsulation layer.

Description of the Related Art

Image sensors (e.g., charge-coupled device (CCD) image sensors, complementary metal-oxide semiconductor (CMOS) image sensors, and so on) are widely used in various image-capturing apparatuses such as digital still-image cameras, digital video cameras, and the like. The light-sensing portion in an image sensor may be formed at each of the pixels, and signal electric charges may be generated according to the amount of light received in the light-sensing portion. In addition, the signal electric charges generated in the light-sensing portion may be transmitted and amplified, whereby an image signal is obtained.

Recently, the trend has been for the pixel size of image sensors (typified by CMOS image sensors) to be reduced for the purpose of increasing the number of pixels per unit area so as to provide higher-resolution images. However, while pixel size continues to decrease, there are still various challenges in the design and manufacturing of image sensors. For example, cross-talk of electrical signals among pixels will be a serious problem with smaller pixel sizes, which may have an adverse influence on the performance of the image sensors. New manufacturing techniques are also needed to further decrease the pixel size without leading to serious cross-talk of electrical signals among pixels. Therefore, these and related issues need to be addressed by improving the design and manufacture of image sensors.

BRIEF SUMMARY

In accordance with some embodiments of the present disclosure, an image sensor is provided. The image sensor includes a substrate and isolation structures disposed on the substrate. The isolation structures are electrically non-conductive and define pixel regions. The image sensor also includes electrodes disposed on the substrate and in direct contact with the isolation structures. The image sensor further includes an active layer disposed between the isolation structures. Moreover, the image sensor includes an encapsulation layer disposed over the active layer. The image sensor also includes a color filter layer disposed over the encapsulation layer.

In some embodiments, a portion of each of the electrodes is mounted in one isolation structure.

In some embodiments, the image sensor further includes a buffer layer disposed on the isolation structures.

In some embodiments, the top surface of the active layer and the topmost surface of the buffer layer are coplanar, or the top surface of the active layer is lower than the topmost surface of buffer layer.

In some embodiments, the buffer layer is an electron transport layer or a hole transport layer.

In some embodiments, the electrodes include anode electrodes and cathode electrodes, the anode electrodes are grounded, and the cathode electrodes are electrically connected to a readout circuit.

In some embodiments, the anode electrodes and the cathode electrodes are perpendicular to the substrate.

In some embodiments, from a top view, each pixel region corresponds to four electrodes.

In some embodiments, from a top view, each of the pixel regions is surrounded by two anode electrodes and two cathode electrodes.

In some embodiments, from a top view, each pixel region is surrounded by three anode electrodes and one cathode electrode, or by one anode electrode and three of the cathode electrodes.

In some embodiments, the anode electrodes and the cathode electrodes form pairs of electrodes, and each pair of electrodes has an electrode space that is equal to or greater than 100 nm.

In some embodiments, from a cross-sectional view, the distance between any two adjacent isolation structures defines an isolation space that is equal to or greater than 100 nm.

In some embodiments, the isolation space is equal to or greater than the electrode space.

In some embodiments, each electrode has a height of between 10 nm and 1000 nm.

In some embodiments, each electrode has a width of between 10 nm and 500 nm.

In some embodiments, the ratio of the height to the width of each electrode is less than 3.

In some embodiments, the isolation structures are higher than the electrodes.

In some embodiments, each isolation structure has a height of between 20 nm and 1500 nm.

In some embodiments, each isolation structure has a width of between 10 nm and 200 nm.

In some embodiments, the image sensor further includes condensing structures disposed above the color filter layer. Each condensing structure corresponds to one pixel region.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1:
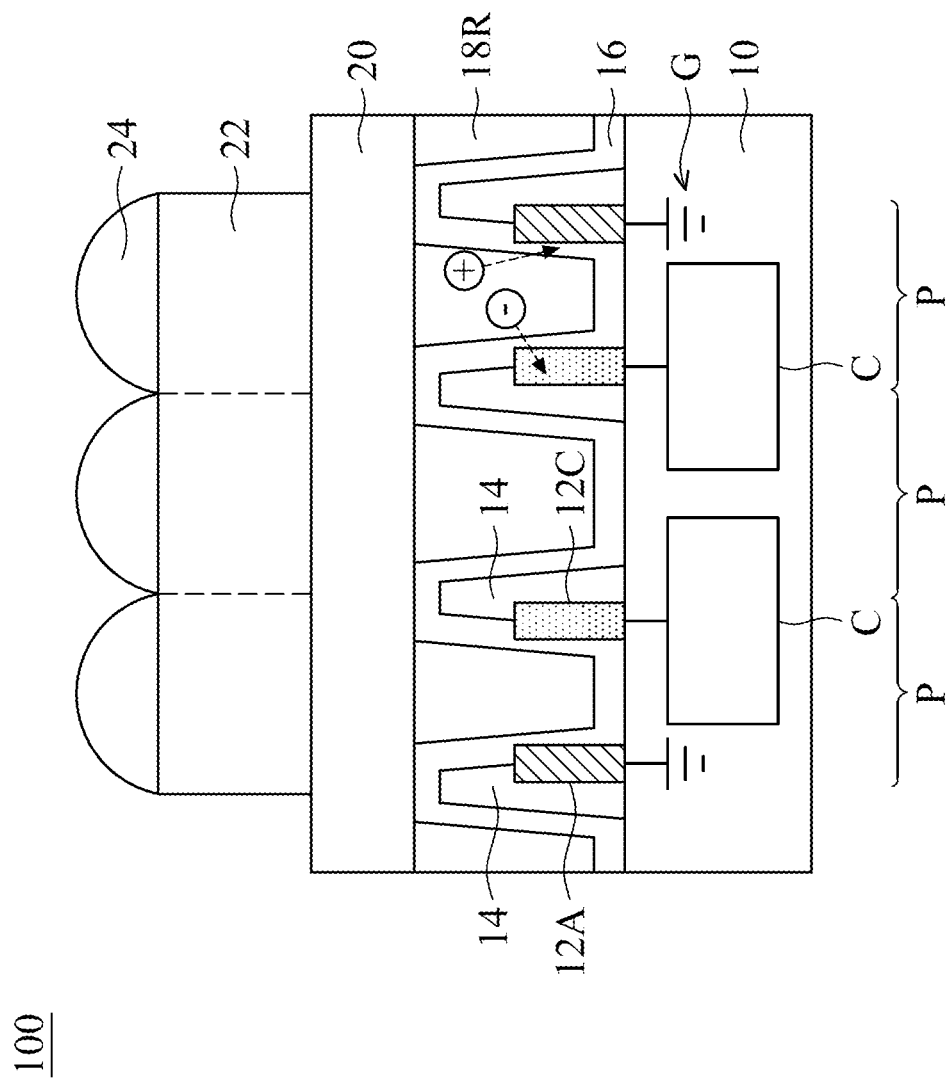
FIG. 1 is a cross-sectional view illustrating a portion of the image sensor in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean+/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

FIG. 1 is a cross-sectional view illustrating a portion of the image sensor 100 in accordance with some embodiments of the present disclosure. FIGS. 2-8 are cross-sectional views illustrating a portion of the image sensor 100 at various stages in the manufacturing of the image sensor 100 in accordance with some embodiments of the present disclosure. It should be noted that some components of the image sensor 100 have been omitted in FIGS. 1-8 for the sake of brevity.

Referring to FIG. 1, the image sensor 100 includes a substrate 10 and isolation structures 14 disposed on the substrate 10. The isolation structures 14 are electrically non-conductive and define pixel regions P. The image sensor 100 also includes electrodes (e.g., anode electrodes 12A and cathode electrodes 12C) disposed on the substrate 10 and in direct contact with the isolation structures 14. The image sensor 100 further includes an active layer 18R disposed between the isolation structures 14. Moreover, the image sensor 100 includes an encapsulation layer 20 disposed over the active layer 18R. The image sensor 100 also includes a color filter layer 22 disposed over the encapsulation layer 20.

As shown in FIG. 1, in some embodiments, the image sensor 100 includes a buffer layer 16 disposed on the isolation structures 14. Moreover, in some embodiments, the image sensor 100 further includes condensing structures 24 disposed above the color filter layer 22. Each condensing structure 24 corresponds to one pixel region P, but the present disclosure is not limited thereto.

Figure 2:
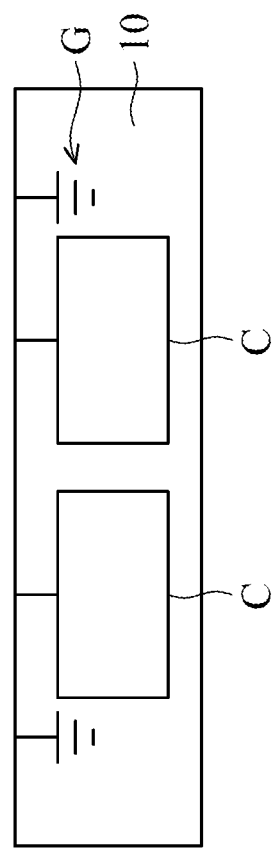
FIG. 2 is a cross-sectional view illustrating a portion of the image sensor at one stage in the manufacturing of the image sensor in accordance with some embodiments of the present disclosure.

FIGS. 2-8 may illustrate a portion of the image sensor 100 at various stages in the manufacturing of the image sensor 100. Referring to FIG. 2, a substrate 10 is provided. The substrate 10 may be, for example, a wafer or a chip, but the present disclosure is not limited thereto. The substrate 10 may be a semiconductor substrate, for example, silicon substrate. Furthermore, the semiconductor substrate may also be an elemental semiconductor including germanium, a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb), an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy, or a combination thereof.

As shown in FIG. 2, in some embodiments, some portions of the substrate 10 are grounded (e.g., portions G), and the substrate 10 includes at least one readout circuit C. In some embodiments, the substrate 10 includes isolation regions (not shown) to separate these components, such as shallow trench isolation (STI) regions or deep trench isolation (DTI) regions. The isolation regions may be formed in the substrate 10 using etching process to form trenches and filling the trenches with an insulating or dielectric material, but the present disclosure is not limited thereto.

Figure 3:
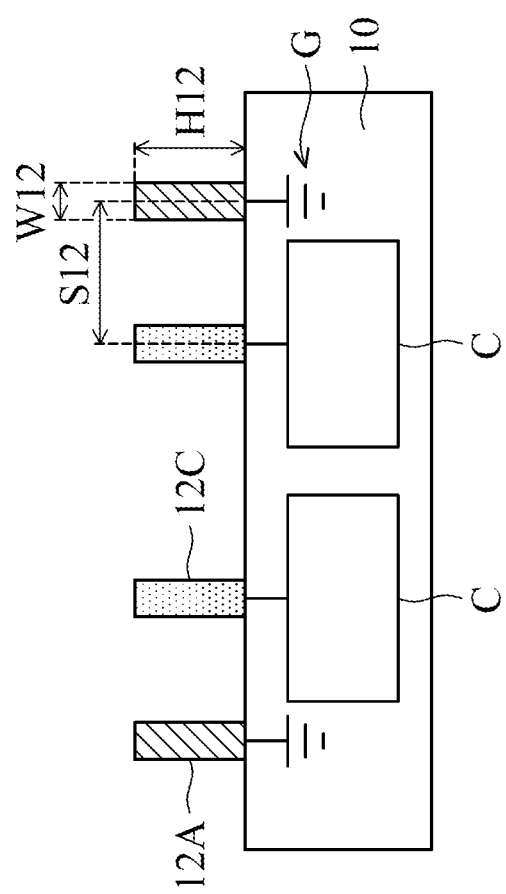
FIG. 3 is a cross-sectional view illustrating a portion of the image sensor at one stage in the manufacturing of the image sensor in accordance with some embodiments of the present disclosure.

Referring to FIG. 3, electrodes, such as anode electrodes 12A and cathode electrodes 12C, are formed on the substrate 10. For example, the electrodes may include aluminum (Al), silver (Ag), an alloy thereof, or a combination thereof, and the electrodes may be formed by a deposition process and a patterning process, but the present disclosure is not limited thereto. Moreover, in this embodiment, the anode electrodes 12A and the cathode electrodes 12C are perpendicular to the substrate 10.

As shown in FIG. 3, in some embodiments, the anode electrodes 12A are grounded G, and the cathode electrodes 12C are electrically connected to the readout circuits C. In some embodiments, the anode electrodes 12A and the cathode electrodes 12C form pairs of electrodes, and each pair of electrodes has an electrode space S12 that is equal to or greater than about 100 nm. Here, electrode space S12 may be defined as the distance between one anode electrode 12A and the corresponding cathode electrode 12C.

In some embodiments, each electrode has a height H12 of between about 10 nm and about 1000 nm. In some embodiments, each electrode has a width W12 of between about 10 nm and about 500 nm. Moreover, in some embodiments, the ratio (H12/W12) of the height to the width of each electrode is less than about 3.

Figure 4:
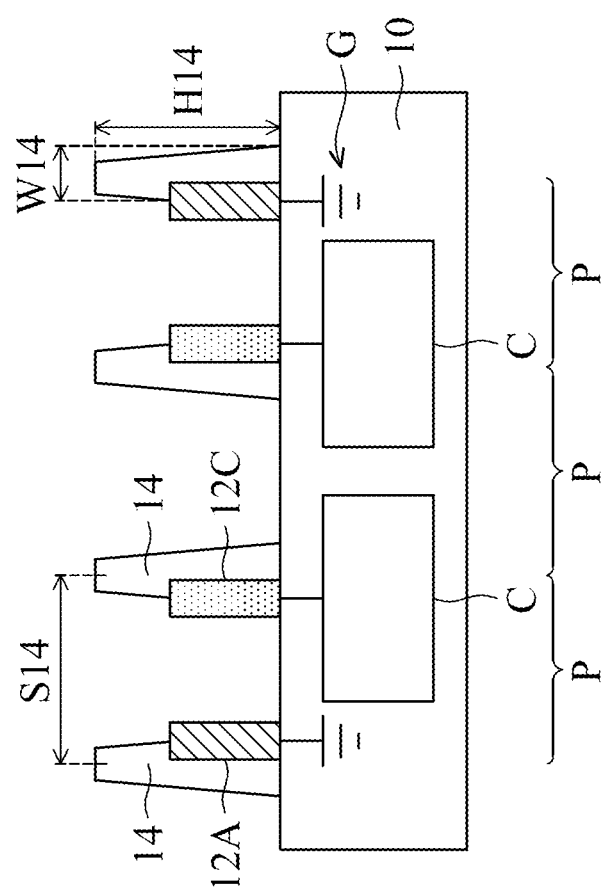
FIG. 4 is a cross-sectional view illustrating a portion of the image sensor at one stage in the manufacturing of the image sensor in accordance with some embodiments of the present disclosure.

Referring to FIG. 4, in some embodiments, isolation structures 14 are formed on the substrate 10. The isolation structures 14 are electrically non-conductive and define pixel regions P. As shown in FIG. 4, the electrodes (e.g., anode electrodes 12A and cathode electrodes 12C) are in direct contact with the isolation structures 14. In some embodiments, a portion of each electrode is mounted in one isolation structure 14. By forming the isolation structure 14, a subsequently formed active layer (e.g., a subsequently formed active layer 18) can be formed within the corresponding pixel regions P, and thus electron/hole cross-talk in the active layer 18 among pixel regions P will be prevented.

The isolation structure 14 may include an electrically non-conductive material, such as silicon nitride, silicon oxide, aluminum oxide, photoresist, other suitable materials, or a combination thereof. The formation of the isolation structure 14 may include using suitable deposition techniques, such as physical vapor deposition (PVD), chemical vapor deposition (CVD), atomic layer deposition (ALD), spin coating, combinations thereof, or the like. After the material for the isolation structure 14 is deposited, photolithography and etching processes are performed to form the isolation structure 14. The cross-sectional profile of the isolation structure 14 may be adjusted by the etching conditions to obtain desired shapes. For example, the isolation structure 14 may have a rectangular shape, a trapezoidal shape, an inversely trapezoidal shape, or a triangular shape in a cross-sectional view, but the present disclosure is not limited thereto.

As shown in FIG. 4, in some embodiments, the distance between two adjacent isolation structures 14 defines an isolation space S14 that is equal to or greater than about 100 nm. In some embodiments, the isolation space S14 is equal to or greater than the electrode space S12 (that is shown in FIG. 3). As shown in FIG. 4, in some embodiments, the isolation structures 14 are higher than the electrodes (e.g., anode electrodes 12A and cathode electrodes 12C). In some embodiments, each isolation structure 14 has a height H14 of between about 20 nm and about 1500 nm. In some embodiments, each isolation structure 14 has a width W14 of between about 10 nm and about 200 nm. Here, the width W14 of each isolation structure 14 may be defined as the maximum width of each isolation structure 14.

Figure 5:
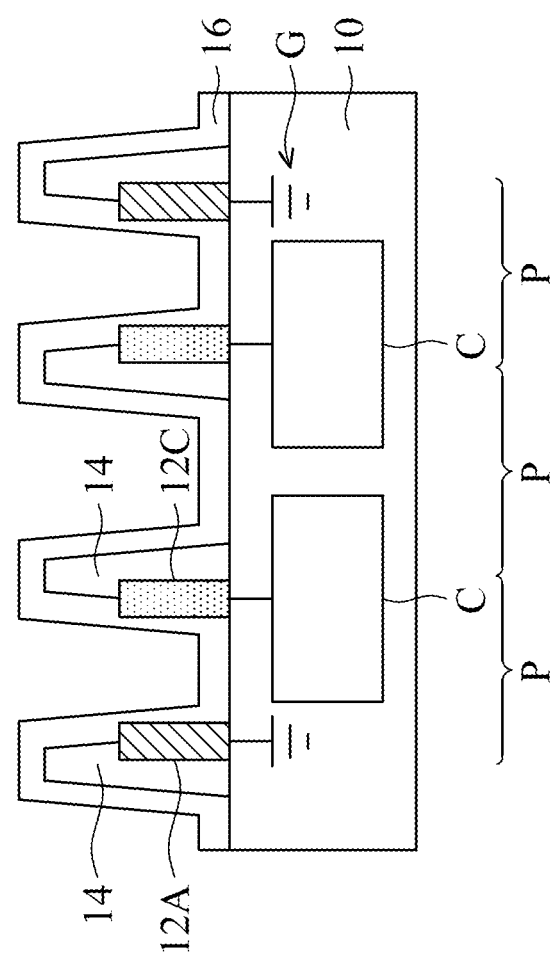
FIG. 5 is a cross-sectional view illustrating a portion of the image sensor at one stage in the manufacturing of the image sensor in accordance with some embodiments of the present disclosure.

Referring to FIG. 5, in some embodiments, a buffer layer 16 is formed on the isolation structures 14. In more detail, the buffer layer 16 may be formed on top surfaces and sidewalls of the isolation structures 14, a portion of top surfaces and sidewalls of the electrodes (e.g., anode electrodes 12A and cathode electrodes 12C), and a portion of the top surface of the substrate 10, but the present disclosure is not limited thereto.

In some embodiments, the buffer layer 16 is an electron transport layer (ETL) or a hole transport layer (HTL). For example, the buffer layer 16 may include titanium dioxide ($TiO_2$), but the present disclosure is not limited thereto.

Figure 6:
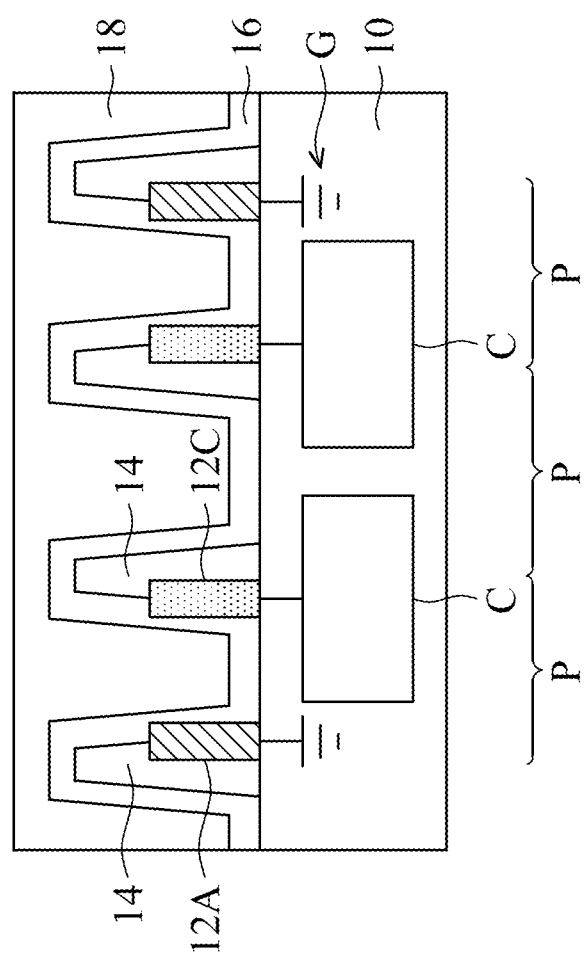
FIG. 6 is a cross-sectional view illustrating a portion of the image sensor at one stage in the manufacturing of the image sensor in accordance with some embodiments of the present disclosure.

Referring to FIG. 6, in some embodiments, an active material 18 is formed on the isolation structures 14. In more detail, the active material 18 may be formed between the isolation structures 14 and cover the isolation structures 14.

For example, the active material 18 may include a photoelectric conversion material that absorbs light irradiation and generates signal charges corresponding to an amount of the absorbed light, such as an organic material, a perovskite material, a quantum dots material, other suitable materials, or a combination thereof. The active material 18 may be formed by a deposition process including spin coating, thermal evaporation, combinations thereof, or the like, but the present disclosure is not limited thereto.

Figure 7:
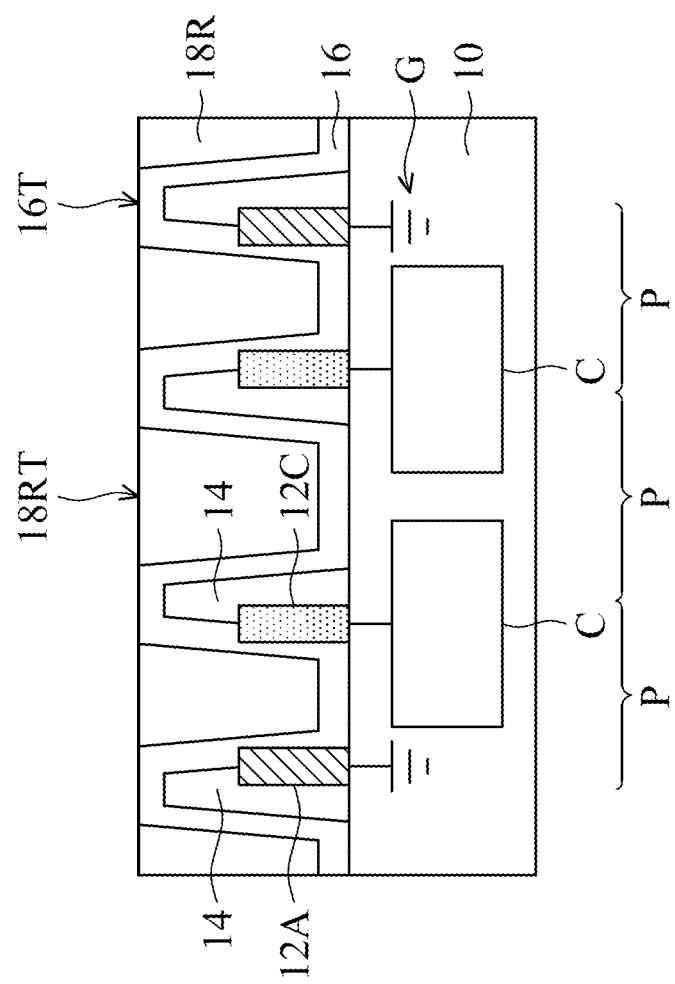
FIG. 7 is a cross-sectional view illustrating a portion of the image sensor at one stage in the manufacturing of the image sensor in accordance with some embodiments of the present disclosure.

Referring to FIG. 7, in some embodiments, a portion of the active material 18 is removed to form an active layer 18R that is disposed between the isolation structures 14. For example, the active material 18 may be planarized with a planarization process, such as a chemical mechanical polishing (CMP) process, but the present disclosure is not limited thereto. The portion of the active material 18 may also be removed by an etching process. In more detail, the portion of the active material 18 that is above the isolation structures 14 and the buffer layer 16 may be removed, so as to avoid electrical cross-talk between pixel regions P (i.e., cut off the conductive lines).

As shown in FIG. 7, in some embodiments, the top surface 18RT of the active layer 18R and the topmost surface 16T of buffer layer 16 are coplanar. In some other embodiments, the top surface 18RT of the active layer 18R is lower than the topmost surface 16T of the buffer layer 16. Therefore, electron/hole cross-talk in the active layer 18R among pixel regions P will be prevented, which allows the image sensor with smaller pixel size to be formed without cross-talk adversely affecting the performance of the image sensor.

Figure 8:
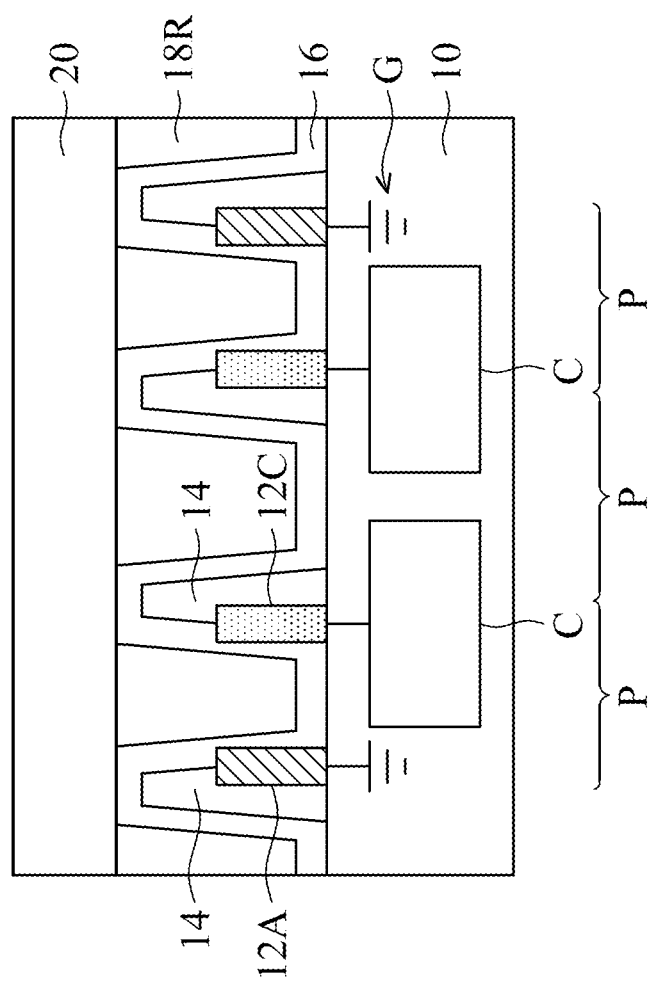
FIG. 8 is a cross-sectional view illustrating a portion of the image sensor at one stage in the manufacturing of the image sensor in accordance with some embodiments of the present disclosure.

Referring to FIG. 8, in some embodiments, an encapsulation layer 20 is formed over the active layer 18R. For example, the encapsulation layer 20 may include silicon nitride, silicon oxide, silicon oxynitride, aluminum oxide, other suitable materials, or a combination thereof. The formation of the encapsulation layer 20 may include using suitable deposition techniques, such as CVD, ALD, spin-on coating combinations thereof, or the like. Furthermore, the encapsulation layer 20 may be planarized with a planarization process, such as a chemical mechanical polishing (CMP) process, to form a substantially flat top surface, but the present disclosure is not limited thereto.

Then, as shown in FIG. 1, a color filter layer 22 is formed over the encapsulation layer 20. As shown in FIG. 1, in some embodiments, the color filter layer 20 has (or is divided into) color filter segments that corresponds to the pixel regions P.

Figure 9:
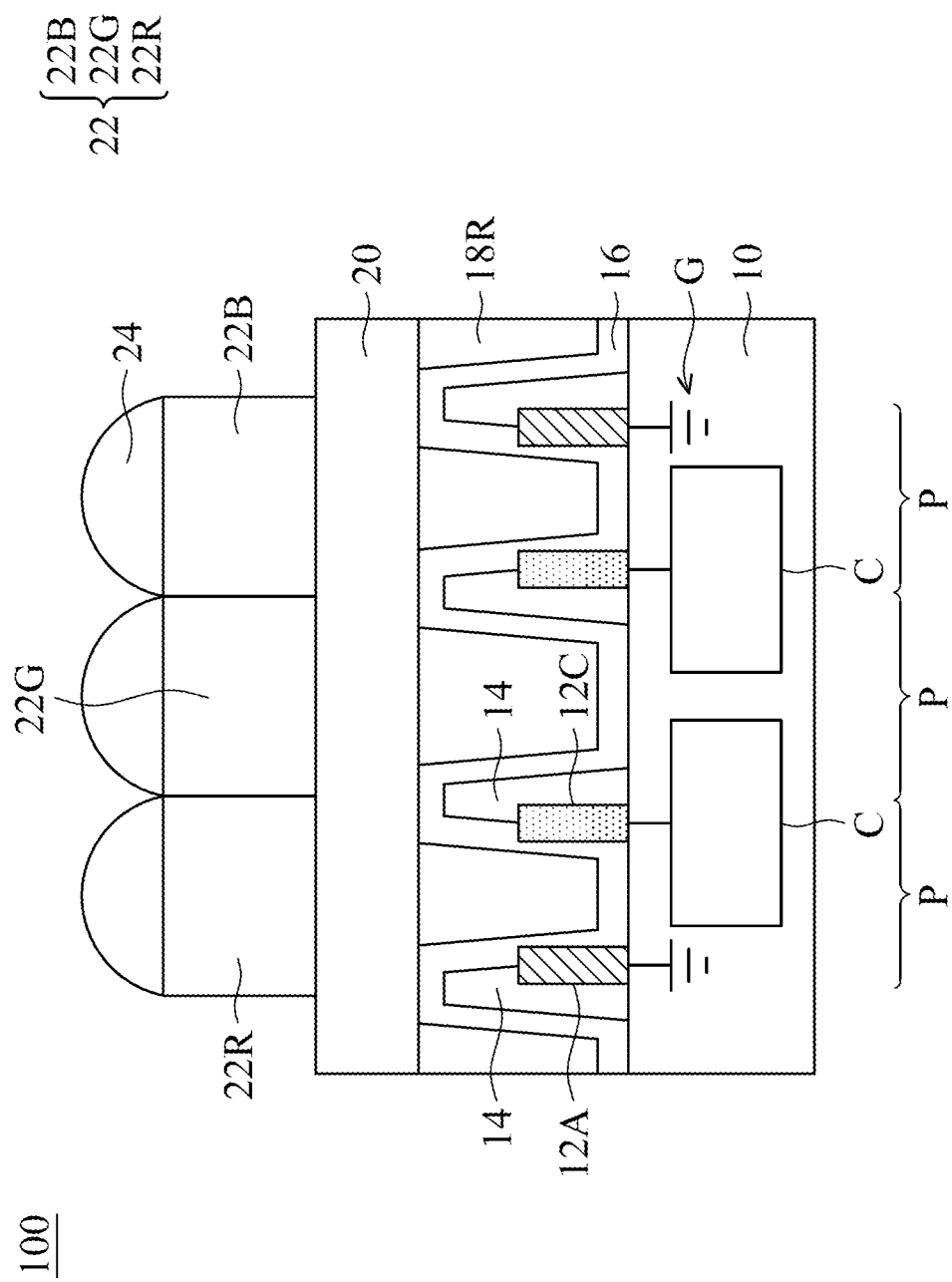
FIG. 9 is a cross-sectional view illustrating an example of a portion of the image sensor.

FIG. 9 is a cross-sectional view illustrating an example of a portion of the image sensor 100. As shown in FIG. 9, the color filter layer 22 may have a blue color filter segment 22B, a green color filter segment 22G, and a red color filter segment 22R, but the present disclosure is not limited thereto. In some other embodiments, the color filter layer 22 has (or is divided into) other color filter segments. For example, the color filter layer 22 may have a yellow color filter segment, a white color filter segment, a cyan color filter segment, a magenta color filter segment, or an IR/NIR color filter segment, but the present disclosure is not limited thereto.

As shown in FIG. 1 and FIG. 9, in some embodiments, condensing structures 24 are formed above the color filter layer 22. The condensing structure 24 may include glass, epoxy resin, silicone resin, polyurethane, any other applicable material, or a combination thereof, but the present disclosure is not limited thereto. For example, the condensing structure 24 may be formed by a photoresist reflow method, a hot embossing method, any other applicable method, or a combination thereof. Moreover, the steps of forming the condensing structure 24 may include a spin coating process, a lithography process, an etching process, any other applicable process, or a combination thereof, but the present disclosure is not limited thereto.

As shown in FIG. 1 and FIG. 9, in some embodiments, each condensing structure 24 corresponds to one color filter segment (e.g., blue color filter segment 22B, green color filter segment 22G, or red color filter segment 22R) and one pixel region P, but the present disclosure is not limited thereto. In some other embodiments, each condensing structure 24 corresponds to four pixel regions P, and the four pixel regions P form a 2×2 array (which may be referred to as quadratic photo diodes (QPD)). Alternately, in some other embodiments, each condensing structure 24 corresponds to two pixel regions P (which may be referred to as dual photo diodes (DPD)).

The condensing structure 24 may be a micro-lens. For example, the micro-lens may include a semi-convex lens or a convex lens, but the present disclosure is not limited thereto. The condensing structure 24 may also include micro-pyramid structures (e.g., circular cone, quadrangular pyramid, and so on), or micro-trapezoidal structures (e.g., flat top cone, truncated square pyramid, and so on). Alternatively, the condensing structure 24 may be a gradient-index structure.

Figure 10:
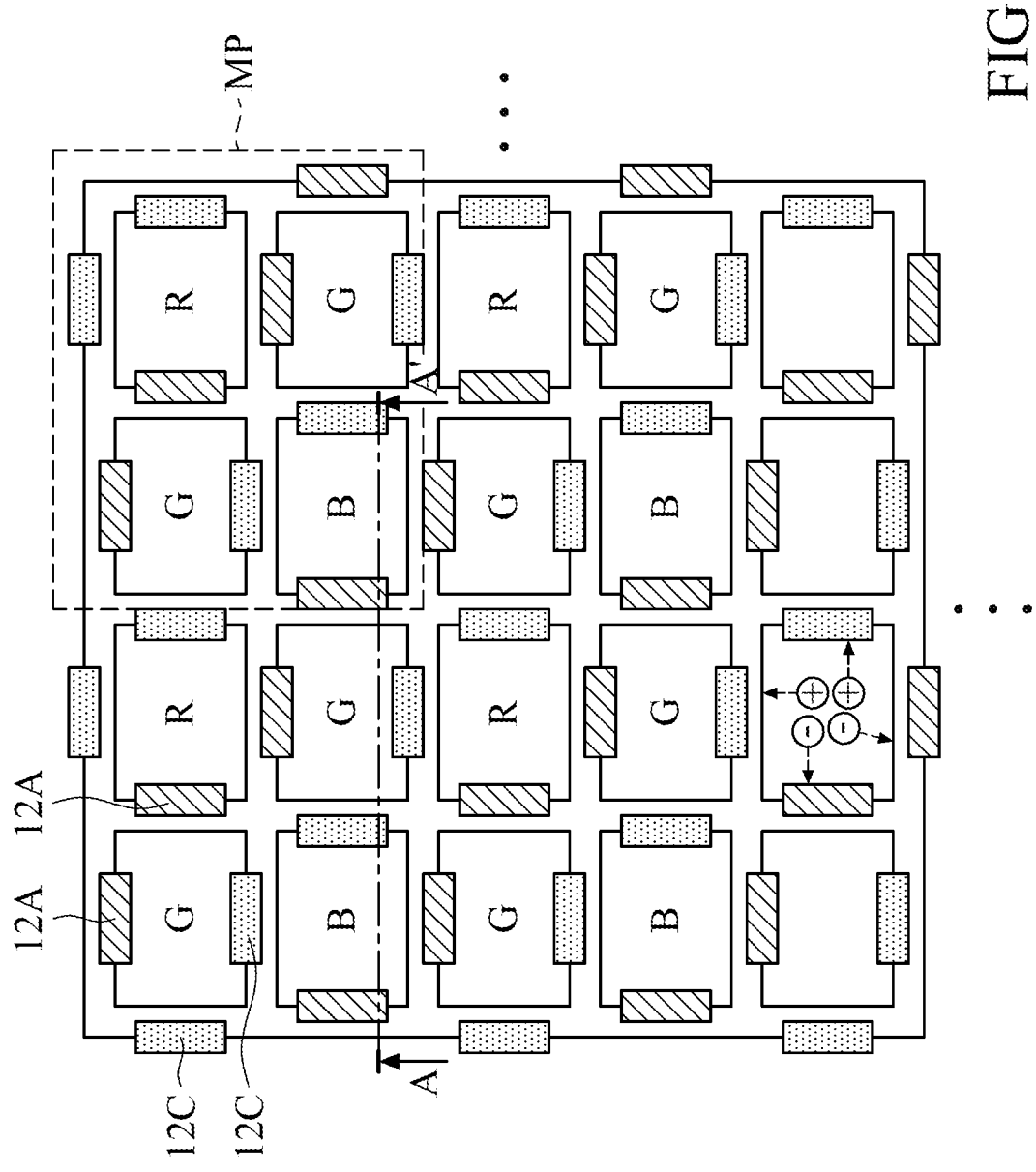
FIG. 10 is a top view illustrating a portion of the image sensor in accordance with some other embodiments of the present disclosure.
Figure 11:
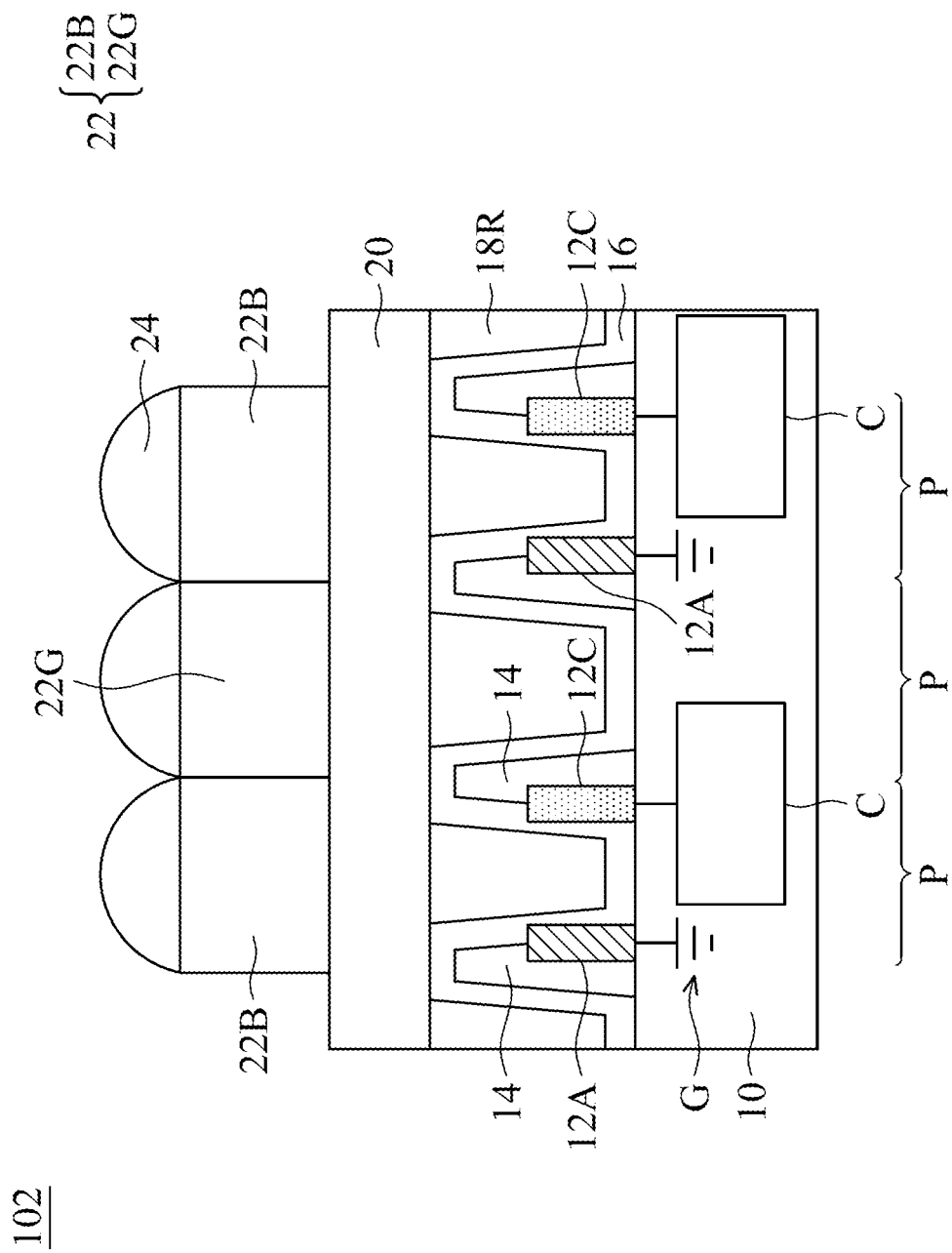
FIG. 11 is a cross-sectional view of a portion of the image sensor along line A-A' in FIG. 10.

FIG. 10 is a top view illustrating a portion of the image sensor 102 in accordance with some other embodiments of the present disclosure. FIG. 11 is a cross-sectional view of a portion of the image sensor 102 along line A-A' in FIG. 10. Similarly, some components of the image sensor 102 have been omitted in FIG. 10 and FIG. 11 for the sake of brevity.

As shown in FIG. 10, in some embodiments, from a top view, the color filter segments, such as blue color filter segments that are marked B, green color filter segment that are marked G, or red color filter segment that are marked R, form a plurality of mosaic patterns MP, and each mosaic patterns MP may include one blue color filter segment B, two green color filter segments G, and one red color filter segment R, but the present disclosure is not limited thereto. The mosaic patterns MP may be referred to as RGGB Bayer Pattern.

Referring to FIG. 10 and FIG. 11, in some embodiments, each pixel region P corresponds to one color filter segment (e.g., blue color filter segment that is marked B, green color filter segment that is marked G, or red color filter segment that is marked R), and each color filter segment is surrounded by four electrodes. That is, in some embodiments, from a top view of the image sensor 102, each pixel region P corresponds to four electrodes as shown in FIG. 10. In more detail, as shown in FIG. 10, in some embodiments, from a top view of the image sensor 102, each pixel region P is surrounded by two anode electrodes 12A and two cathode electrodes 12C.

Figure 12:
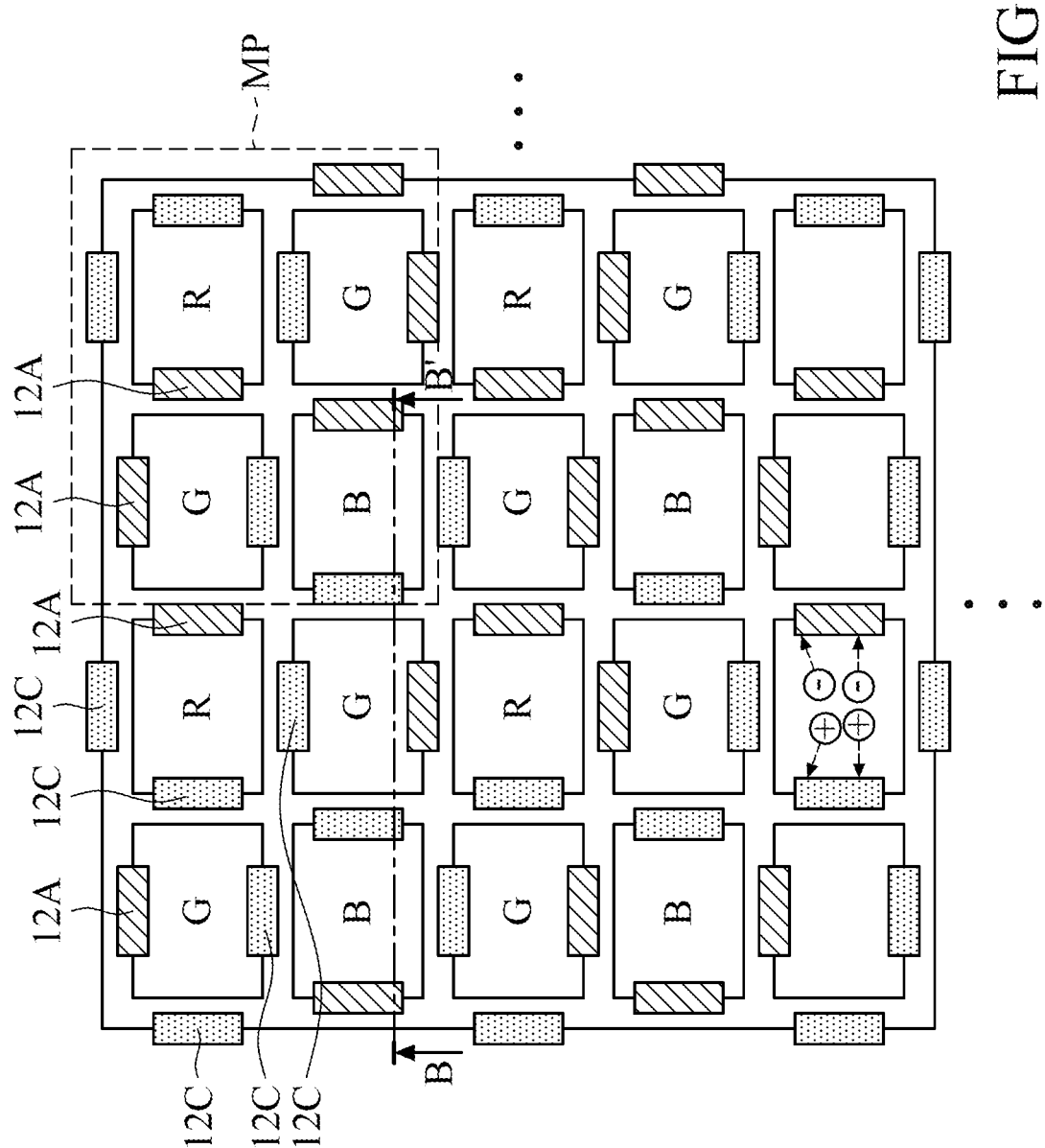
FIG. 12 is a top view illustrating a portion of the image sensor in accordance with some other embodiments of the present disclosure.
Figure 13:
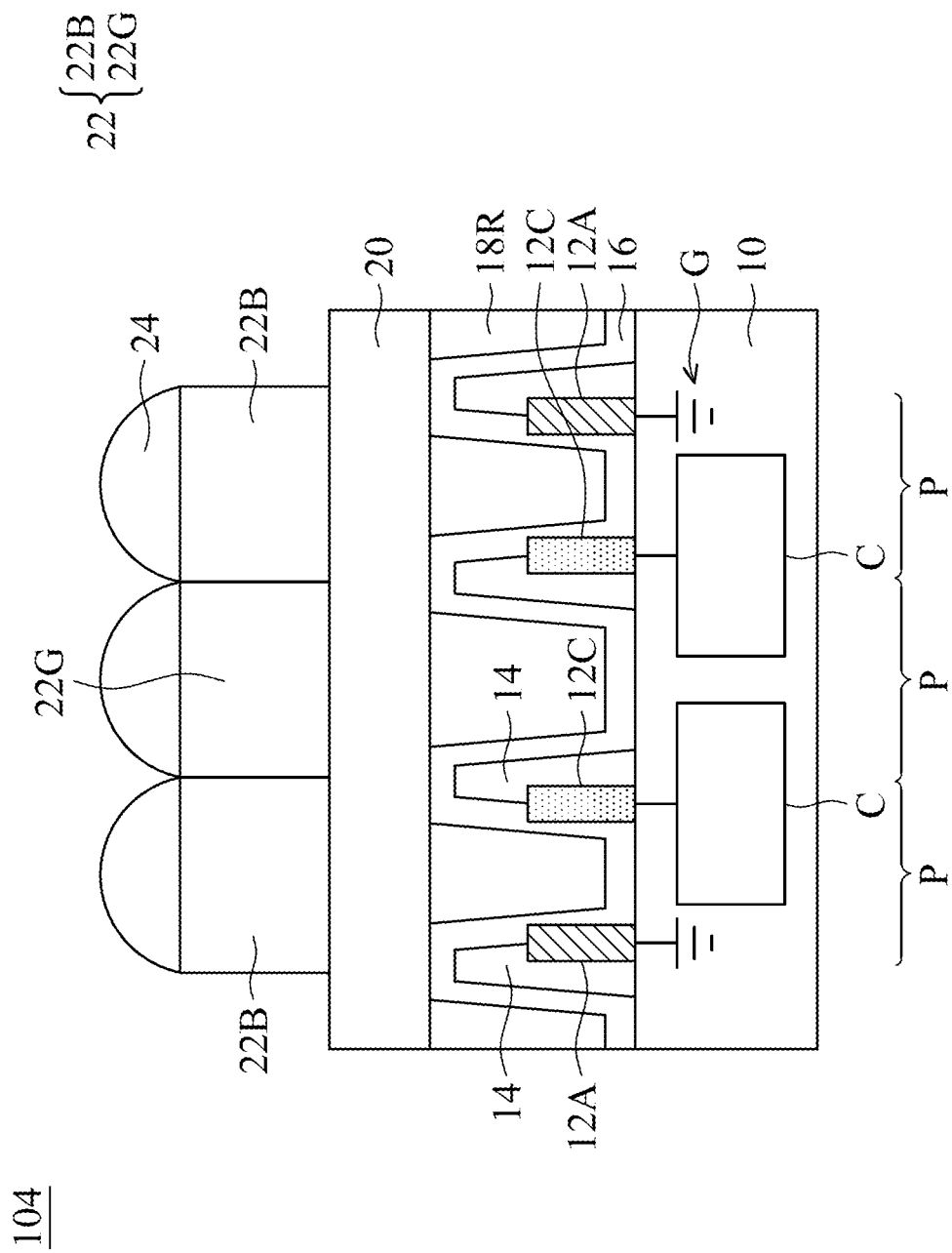
FIG. 13 is a cross-sectional view of a portion of the image sensor along line B-B' in FIG. 12.

FIG. 12 is a top view illustrating a portion of the image sensor 104 in accordance with some other embodiments of the present disclosure. FIG. 13 is a cross-sectional view of a portion of the image sensor 104 along line B-B' in FIG. 12. Similarly, some components of the image sensor 104 have been omitted in FIG. 12 and FIG. 13 for the sake of brevity.

Similarly, as shown in FIG. 12, each mosaic patterns MP may include one blue color filter segment B, two green color filter segments G, and one red color filter segment R, which may be referred to as RGGB Bayer Pattern, but the present disclosure is not limited thereto. Referring to FIG. 12 and FIG. 13, in some embodiments, each region P corresponds to one color filter segment (e.g., blue color filter segment that is marked B, green color filter segment that is marked G, or red color filter segment that is marked R), and each color filter segment is surrounded by four electrodes. That is, in some embodiments, from a top view of the image sensor 104, each region P corresponds to four electrodes as shown in FIG. 12. In more detail, as shown in FIG. 12, in some embodiments, from a top view of the image sensor 104, each pixel region P is surrounded by three anode electrodes 12A and one cathode electrode 12C, or by one anode electrode 12A and three cathode electrodes 12C.

In summary, the image sensor of the embodiments of the present disclosure includes isolation structures and a portion of each electrode may be mounted in one isolation structure, so that electron/hole cross-talk in the organic material among pixels will be prevented, which allows the image sensor with smaller pixel size to be formed without crosstalk adversely affecting the performance of the image sensor.

Moreover, the image sensor of the embodiments of the present disclosure may be made without sputter process and may be encapsulated immediately, which may effectively reduce the process time and cost. Furthermore, the image sensor of the embodiments of the present disclosure is formed without a transparent electrode between the active layer and the encapsulation layer, thereby reducing the interface reflection.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. An image sensor, comprising:
   a substrate;
   isolation structures disposed on the substrate, wherein the isolation structures are electrically non-conductive and define pixel regions;
   electrodes disposed on the substrate and in direct contact with the isolation structures;
   a buffer layer disposed on top surfaces and sidewalls of the isolation structures and a portion of top surfaces and sidewalls of the electrodes;
   an active layer disposed between the isolation structures;
   an encapsulation layer disposed over the active layer and the buffer layer; and
   a color filter layer disposed over the encapsulation layer.

2. The image sensor as claimed in claim 1, wherein a portion of each of the electrodes is mounted in one of the isolation structures.

3. The image sensor as claimed in claim 1, wherein a top surface of the active layer and a topmost surface of the buffer layer are coplanar, or the top surface of the active layer is lower than the topmost surface of buffer layer.

4. The image sensor as claimed in claim 1, wherein the buffer layer is an electron transport layer or a hole transport layer.

5. The image sensor as claimed in claim 1, wherein the electrodes comprise anode electrodes and cathode electrodes, the anode electrodes are grounded, and the cathode electrodes are electrically connected to a readout circuit.

6. The image sensor as claimed in claim 5, wherein the anode electrodes and the cathode electrodes are perpendicular to the substrate.

7. The image sensor as claimed in claim 5, wherein from a top view, each of the pixel regions corresponds to four of the electrodes.

8. The image sensor as claimed in claim 5, wherein from a top view, each of the pixel regions is surrounded by two of the anode electrodes and two of the cathode electrodes.

9. The image sensor as claimed in claim 5, wherein from a top view, each of the pixel regions is surrounded by three of the anode electrodes and one of the cathode electrodes, or by one of the anode electrodes and three of the cathode electrodes.

10. The image sensor as claimed in claim 5, wherein the anode electrodes and the cathode electrodes form pairs of electrodes, and each of the pairs of electrodes has an electrode space that is equal to or greater than 100 nm, and the electrode space is defined as a distance between one of the anode electrodes and a corresponding one of the cathode electrodes.

11. The image sensor as claimed in claim 10, wherein from a cross-sectional view, a distance between adjacent two of the isolation structures defines an isolation space that is equal to or greater than 100 nm.

12. The image sensor as claimed in claim 11, wherein the isolation space is equal to or greater than the electrode space.

13. The image sensor as claimed in claim 1, wherein each of the electrodes has a height of between 10 nm and 1000 nm.

14. The image sensor as claimed in claim 13, wherein each of the electrodes has a width of between 10 nm and 500 nm.

15. The image sensor as claimed in claim 14, wherein a ratio of the height to the width of each of the electrodes is less than 3.

16. The image sensor as claimed in claim 13, wherein the isolation structures are higher than the electrodes.

17. The image sensor as claimed in claim 1, wherein each of the isolation structures has a height of between 20 nm and 1500 nm.

18. The image sensor as claimed in claim 1, wherein each of the isolation structures has a width of between 10 nm and 200 nm.

19. The image sensor as claimed in claim 1, further comprising:
    condensing structures disposed above the color filter layer, wherein each of the condensing structures corresponds to one of the pixel regions.

* * * * *